(12) United States Patent
So et al.

(10) Patent No.: US 6,252,805 B1
(45) Date of Patent: Jun. 26, 2001

(54) SEMICONDUCTOR MEMORY DEVICE INCLUDING PROGRAMMABLE OUTPUT PIN DETERMINING UNIT AND METHOD OF READING THE SAME DURING TEST MODE

(75) Inventors: Byung-se So; Jin-ho So, both of Kyungki-do (KR)

(73) Assignee: Samsung Electronics Co., Ltd., Suwon (KW)

( * ) Notice: Subject to any disclaimer, the term of this patent is extended or adjusted under 35 U.S.C. 154(b) by 0 days.

(21) Appl. No.: 09/540,988

(22) Filed: Mar. 31, 2000

(30) Foreign Application Priority Data

May 4, 1999 (KR) .................................................. 99-16008

(51) Int. Cl.$^7$ ...................................................... G11C 7/00

(52) U.S. Cl. ...................................... 365/189.07; 365/201

(58) Field of Search ................................ 365/189.07, 201

(56) References Cited

U.S. PATENT DOCUMENTS 5,757,809 * 5/1998 Kiso et al. ........................... 371/21.1

* cited by examiner

Primary Examiner—David Nelms
Assistant Examiner—M. Tran
(74) Attorney, Agent, or Firm—Jones Volentine, P.L.L.C.

(57) ABSTRACT

A semiconductor memory device is disclosed that programmably varies an output pin transmitting output data from a comparator during a test mode. Also disclosed is a read method for the test mode. The semiconductor memory device includes a comparator that compares a plurality of output data read from the memory cell array and an output pin determining unit that programmably varies a pin transmitting an output of the comparator during the test mode. Thus, when multiple semiconductor memory devices are installed in a single memory module, the output pins of the semiconductor memory devices are variously determined using the output pin determining unit so that data can be simultaneously read from more than one semiconductor memory device at a time during a test of a memory module, to thereby reduce the module test time.

10 Claims, 3 Drawing Sheets

SEMICONDUCTOR MEMORY DEVICE INCLUDING PROGRAMMABLE OUTPUT PIN DETERMINING UNIT AND METHOD OF READING THE SAME DURING TEST MODE

This application relies for priority upon Korean Patent Application No. 99-16008, filed on May 4, 1999, the contents of which are herein incorporated by reference in their entirety.

BACKGROUND OF THE INVENTION

The present invention relates to semiconductor memory devices, and more particularly, to the testing of semiconductor memory devices having memory modules.

High speed semiconductor memory devices are partially designed to receive or transmit input and output signals such as data or addresses through a bus-type transmission line. In the bus-type structure, various semiconductor memory devices are connected in common to one bus, and only one semiconductor memory device can load data onto the bus at the time. If two or more semiconductor memory devices simultaneously attempt to load data onto the bus, the data collides with each other, which causes a malfunction.

A Rambus dynamic random access memory (DRAM), which is a type of high speed semiconductor memory device, employs the above-described bus-type structure, as well as a proposed special module for supporting the bus-type structure. FIG. 1 is a block diagram of a Rambus DRAM memory module having the bus-type structure.

Referring to FIG. 1, a memory module 200 includes a plurality of semiconductor memory devices $M_1$ through $M_n$, each having a plurality of input and output pins $DQ_1$ to $DQ_w$, i.e., Rambus DRAMs. Furthermore, identical input and output pins of the semiconductor memory devices $M_1$ to $M_n$ are connected in common to a corresponding data bus. In other words, first input and output pins $DQ_1$ of each of the semiconductor memory devices $M_1$ to $M_n$ are connected in common to a data bus $DB_1$; second input and output pins $DQ_2$ are connected in common to a data bus $DB_2$; and so on until $W^{th}$ input and output pins $DQ_w$ of the semiconductor memory devices $M_1$ to $M_n$ are connected in common to a $w^{th}$ data bus $DB_w$. Input and output pins of a controller 100, which is a master controller, are connected to corresponding data buses.

In the memory module having the bus-type structure of FIG. 1, identical data can be simultaneously written to various semiconductor memory devices during a write operation. However, when data is simultaneously read from two or more semiconductor memory devices during a read operation, the data collides with each other on the data bus. As a result, data may only be read from one semiconductor memory devices at a time.

FIG. 2 is a block diagram of a conventional output data merge circuit which is in each of the semiconductor memory devices of FIG. 1. Referring to FIG. 2, during a normal mode, a plurality of output data $DO_1$ to $DO_w$ read from a memory cell array 21 are simultaneously output through a plurality of output pins $DQ_1$ through $DQ_w$. During a test mode, however, a comparator 22 merges the plurality of output data $DO_1$ through $DO_w$ read from the memory cell array 21 and outputs the result to a single predetermined output pin, e.g., $DQ_1$.

Thus, when the semiconductor memory devices, including the output data merge circuit of FIG. 2, are employed as the memory modules of FIG. 1, all of the semiconductor memory devices output their data to a data bus, e.g., a data bus $DB_1$ through a predetermined output pin $DQ_1$ during read operations of a test mode. Thus, when the data is read from two or more semiconductor memory devices, the data collide with each other on the data bus $DB_1$.

As a result, when the semiconductor memory devices, including the conventional output data merge circuit, are employed in the memory module of FIG. 1, the data must be read from only one semiconductor memory device at a time during testing of the memory module. In other words, only one semiconductor memory device can be tested at a time, so that memory module time is lengthened.

SUMMARY OF THE INVENTION

It is an objective of the present invention to provide a semiconductor memory device capable of programmably varying a pin that transmits output data during a test mode to read data simultaneously from various semiconductor memory devices during the testing of a memory module having the bus-type structure described above.

It is another objective of the present invention to provide a read method in a test mode of a semiconductor memory device capable of simultaneously reading data from various semiconductor memory devices during the testing of the memory module having the bus-type structure described above.

It is still another objective of the present invention to provide a method for testing a memory module capable of reducing test time of the memory module having the bus-type structure described above.

Accordingly, to achieve the first objective, there is provided a semiconductor memory device, comprising a memory cell array providing a plurality of output data, a plurality of output pins connected to the memory cell array, a comparator that compares the plurality of output data, and provides a comparison result signal, and an output pin determining unit that programmably selects one of the plurality of output pins. During a test mode, the comparison result signal is output through the selected output pin.

Only the comparison result signal is transmitted through the selected output pin during the test mode. The plurality of output data are output through the plurality of output pins during a normal mode.

The comparator may comprise an exclusive or gate. The output pin determining unit may comprise a register that stores a predetermined number applied from the outside of the semiconductor memory device, and a selection unit that selects one of the plurality of output pins based on the predetermined number. The selection unit may itself further comprise a demultiplexer for providing the comparison result signal only to the selected output pin.

The semiconductor memory device may further comprise a plurality of multiplexers, each connected to one of the plurality of output pins, for connecting the memory cell array to the plurality of output pins during a normal operation mode, and for connecting the comparison result signal to the selected output pin during the test mode. The output pin determining unit and the plurality of multiplexers are all preferably controlled by a test control signal.

To achieve the second objective, there is provided a read method of a test mode with respect to a semiconductor memory device including a memory cell array and a plurality of output pins. The method comprises storing a predetermined number applied from the outside of the semiconductor memory device, selecting one of the plurality of output pins corresponding to the predetermined number, comparing a plurality of output data read from the memory cell array during the test mode to generate a comparison result signal, and outputting the comparison result signal to the selected output pin.

To achieve the third objective, there is provided a method for testing a memory module that comprises a plurality of semiconductor memory devices having a memory cell array and a plurality of output pins, the semiconductor memory devices being connected in common to a plurality of data buses corresponding to output pins of the semiconductor memory device. The method comprises applying one of a plurality of predetermined numbers to each of the semiconductor memory devices to determine a corresponding output pin for each of memory devices during a test mode, and reading data synchronously from each of the semiconductor memory devices via output pins corresponding to the predetermined numbers applied to each memory device. If possible, the predetermined numbers should all be mutually exclusive.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
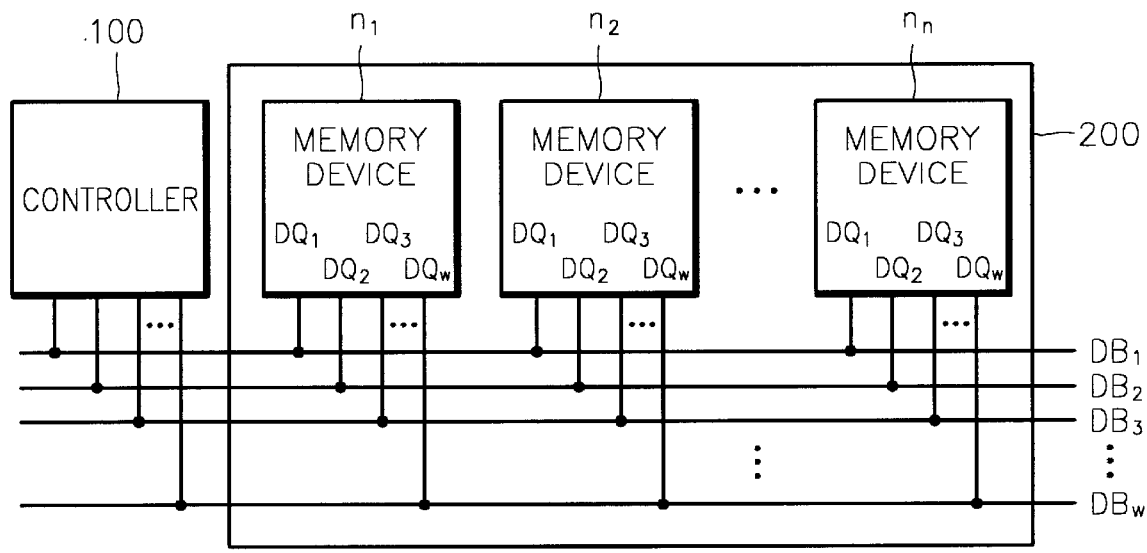
FIG. 1 is a block diagram of a memory module having a Rambus DRAM bus-type structure.
Figure 2:
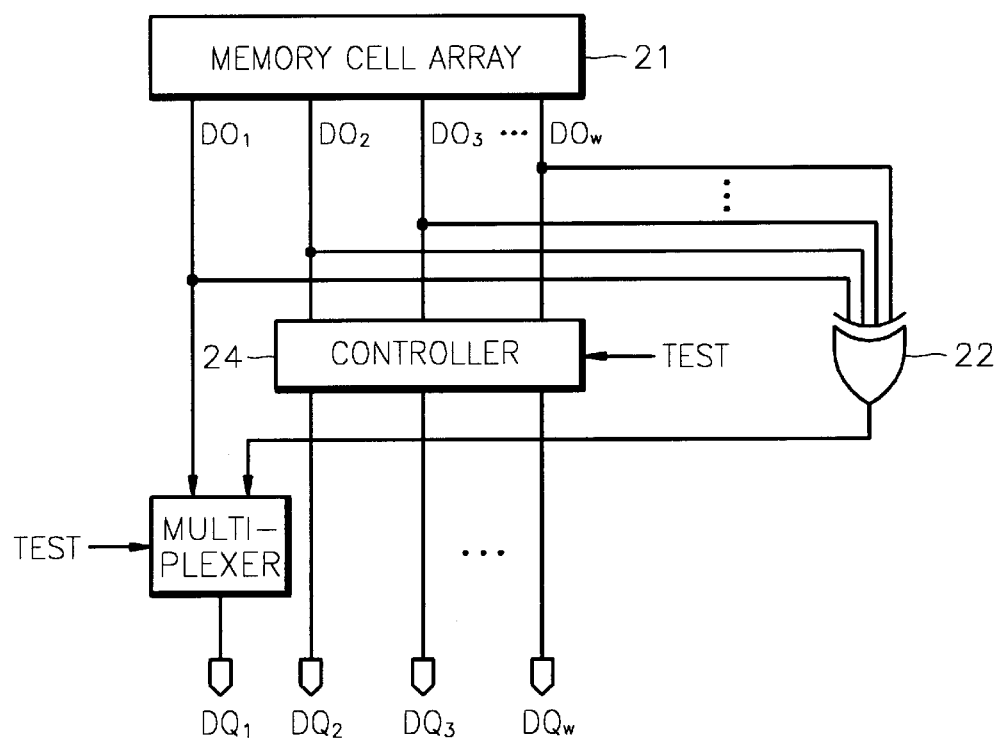
FIG. 2 is a block diagram of a conventional output data merge circuit of the semiconductor memory device of FIG. 1.

The present invention now will be described more fully with reference to the accompanying drawings, in which a preferred embodiment of the invention is shown. This invention may, however, be embodied in many different forms and should not be construed as being limited to the embodiment set forth herein; rather, this embodiment is provided so that this disclosure will be thorough and complete, and will fully convey the concept of the invention to those skilled in the art. The same reference numerals in different drawings represent the same element, and thus their description will be omitted.

Figure 3:
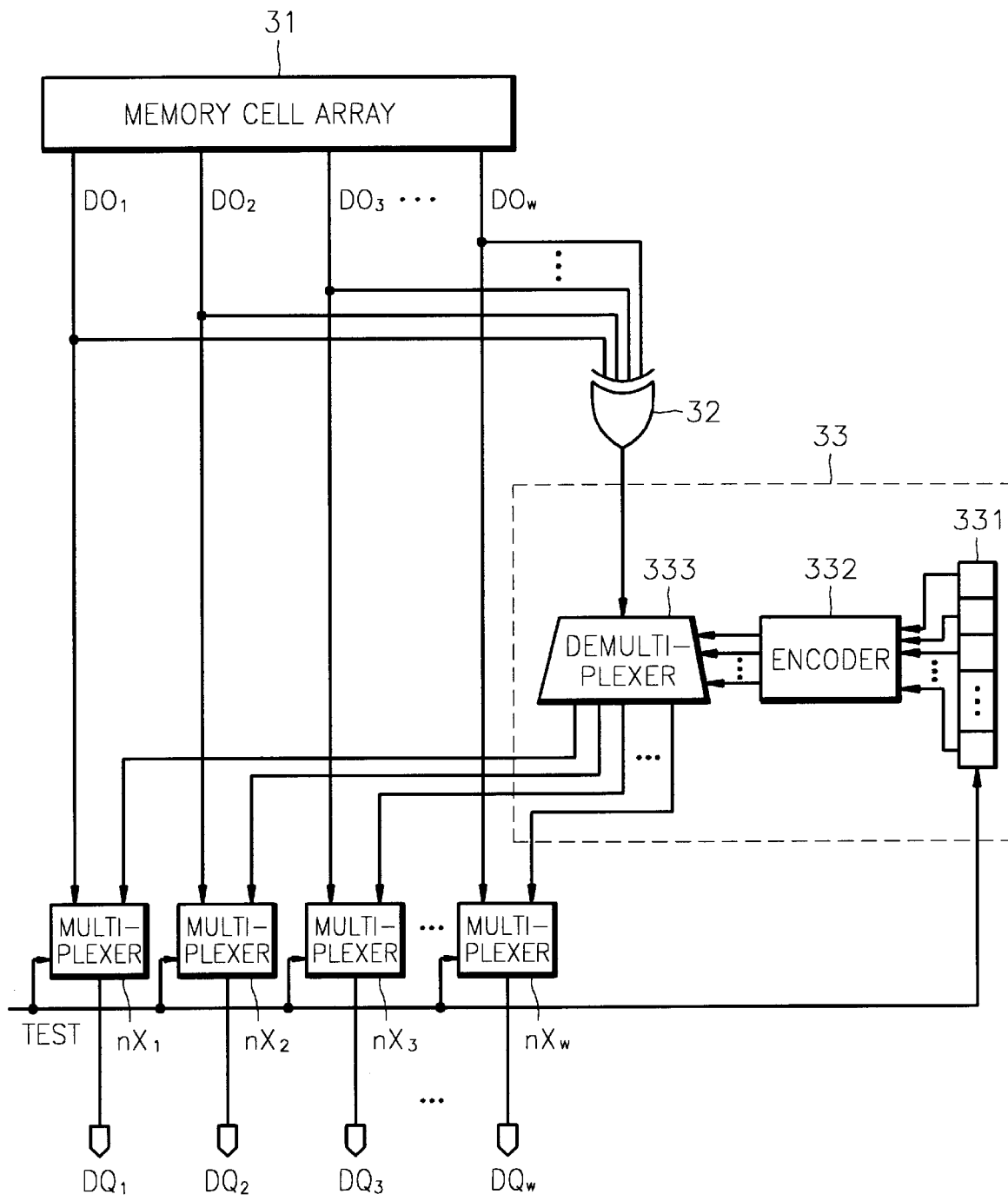
FIG. 3 is a block diagram of a semiconductor memory device according to a preferred embodiment of the present invention.

FIG. 3 is a block diagram of a semiconductor memory device according to a preferred embodiment of the present invention.

Referring to FIG. 3, the semiconductor memory device according to the present invention includes a memory cell array 31, a comparator 32, a plurality of output pins $DQ_1$ through $DQ_w$, an output pin determining unit 33, and a plurality of multiplexers $MX_1$ through $MX_w$.

During the normal mode of the semiconductor memory device, a plurality of output data $DO_1$ through $DO_w$ read from the memory cell array 31 are output to the plurality of output pins $DQ_1$ through $DQ_w$. In detail, during the normal mode, a test control signal TEST is deactivated, and thus the plurality of output data $DO_1$ through $DO_w$ are simultaneously output to the plurality of output pins $DQ_1$ through $DQ_w$ through the plurality of multiplexers $MX_1$ through $MX_w$.

During a test mode, however, the comparator 32 operates to merge the plurality of output data $DO_1$ through $DO_w$ read from the memory cell array 31 and to output the merged data to an output pin. The comparator 32 compares the plurality of output data $DO_1$ through $DO_w$ to output a comparison result. FIG. 3 shows that the preferred embodiment of the comparator 32 comprises an exclusive OR gate comparing the output data $DO_1$ through $DO_w$, where the output data $DO_1$ through $DO_w$ to be read from the memory cell array 31 are all identical. Here, when the comparison result of the comparator 32 is logic high, it is determined that the output data $DO_1$ to $DO_w$ have different data and thus it is determined the semiconductor memory device has failed, and when the comparison result of the comparator 32 is logic low, it is determined that the output data $DO_1$ to $DO_w$ are identical and thus it is determined that the semiconductor memory device is good.

In particular, the output pin determining unit 33 for programmably varying the pin among the output pins $DQ_1$ through $DQ_w$, to which the output of the comparator 32 is output, includes a register 331, an encoder 332, and a demultiplexer 333. To be more specific, the register 331 stores a specific number applied from the outside of the semiconductor memory device and the encoder 332 encodes the specific number stored in the register 331 during the test mode. The demultiplexer 333, which is a selecting unit, outputs the output of the comparator 32 to the output pin selected in response to the outputs of the encoder 332. In other words, during the test mode, the output of the comparator 32 is only output to the selected pin via the demultiplexer 333 and one of the multiplexers $MX_1$ through $MX_w$. The remaining outputs of the demultiplexer 333 are kept floating, so that even though the remaining multiplexers $MX_1$ through $MX_w$ are activated, they only pass a floating signal.

As a result, in the semiconductor memory device according to the present invention, it is possible to programmably vary the pin to which the output of the comparator 32 is output by the output pin determining unit 33 during the test mode. This means that it is possible to determine an arbitrary output pin among the output pins $DQ_1$ through $DQ_w$.

Figure 4:
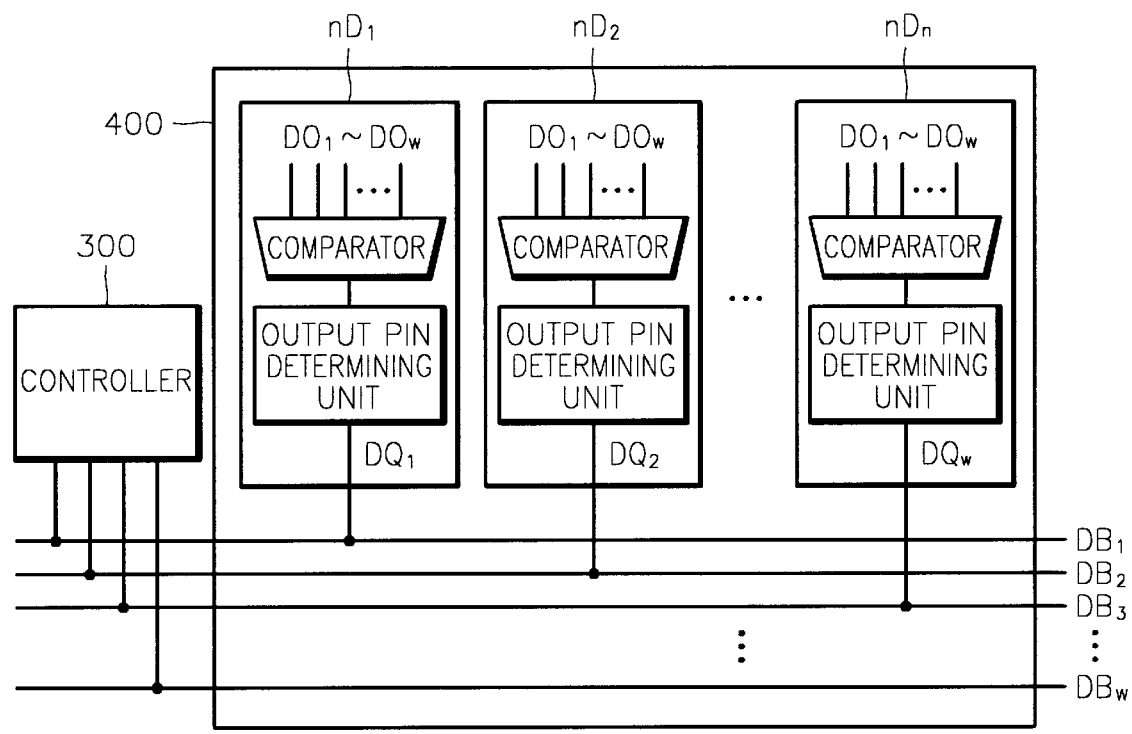
FIG. 4 is a block diagram illustrating a read method of the semiconductor memory device of FIG. 3 employed by the memory module having a bus-type structure of FIG. 1.

FIG. 4 is a block diagram illustrating a read method of the semiconductor memory device of FIG. 3 employed by the memory module having a bus-type structure of FIG. 1. A method for testing a memory module according to the present invention will now be described with respect to FIG. 4.

Specific numbers, which are different to each other, are applied to the register 331 of each of the semiconductor memory devices $MD_1$ to $MD_n$ and output pins corresponding to the specific numbers are determined, and then the test mode of the memory module is activated. For instance, the number 1 is applied to the first semiconductor memory device $MD_1$ and so the first output pin $DQ_1$ is determined as a pin transmitting an output of the first comparator; the number 2 is applied to the second semiconductor memory device $MD_2$ and so the second output pin $DQ_2$ is determined as a pin transmitting an output of the second comparator; and so on for each of the memory devices.

Thus, during the read operation in the test mode, the output of the first comparator of the first semiconductor memory device $MD_1$ is output to the first data bus $DB_1$ through the first output pin $DQ_1$; the output of the second comparator of the second semiconductor memory device $MD_2$ is output to the second data bus $DB_2$ through the second output pin $DQ_2$; up until the $n^{th}$ output of the $n^{th}$ comparator of the $n^{th}$ semiconductor memory device $MD_n$ is output to a $n^{th}$ data bus $DB_w$ through the $n^{th}$ output pin $DQ_w$. Thus, during the read operation in the test mode, collision of data on the data bus can be prevented and data can be simultaneously read from various semiconductor memory devices $MD_1$ to $MD_n$.

If the number n of semiconductor memory devices installed in the memory module is larger than number w of data buses, data can be simultaneously read from w semiconductor memory devices to be tested and then other semiconductor memory devices can be sequentially tested by w.

As described above, according to the semiconductor memory device of the present invention, a pin that outputs the output data from the comparator can be programmably varied during the test mode. Thus, when the semiconductor memory device is installed in the memory module, the output pins of each of the semiconductor memory devices are variously determined so that data can be simultaneously read from the various semiconductor memory devices. Thus, the module test time can be reduced.

What is claimed is:

1. A semiconductor memory device comprising:
    a memory cell array providing a plurality of output data;
    a plurality of output pins connected to the memory cell array;
    a comparator that compares the plurality of output data, and provides a comparison result signal; and
    an output pin determining unit that programmably selects one of the plurality of output pins,
    wherein during a test mode, the comparison result signal is output through the selected output pin.

2. A semiconductor memory device, as recited in claim 1, wherein during a normal mode, the plurality of output data are output through the plurality of output pins.

3. A semiconductor memory device, as recited in claim 1, wherein the comparator comprises an exclusive or gate.

4. A semiconductor memory device, comprising:
    a memory cell array providing a plurality of output data;
    a plurality of output pins connected to the memory cell array;
    a comparator that compares the plurality of output data, and provides a comparison result signal; and
    an output pin determining unit that programmably selects one of the plurality of output pins,
    wherein during a test mode, the comparison result signal is output through the selected output pin,
    wherein the output pin determining unit comprises:
        a register that stores a predetermined number applied from the outside of the semiconductor memory device; and
        a selection unit that selects one of the plurality of output pins based on the predetermined number.

5. A semiconductor memory device, as recited in claim 4, wherein the selection unit further comprises a demultiplexer for providing the comparison result signal only to the selected output pin.

6. A semiconductor memory device, comprising:
    a memory cell array providing a plurality of output data;
    a plurality of output pins connected to the memory cell array;
    a comparator that compares the plurality of output data, and provides a comparison result signal;
    an output pin determining unit that programmably selects one of the plurality of output pins; and
    a plurality of multiplexers, each connected to one of the plurality of output pins, for connecting the memory cell array to the plurality of output pins during a normal operation mode, and for connecting the comparison result signal to the selected output pin during the test mode,
    wherein during a test mode, the comparison result signal is output through the selected output pin.

7. A semiconductor memory device, as recited in claim 6, wherein the output pin determining unit and the plurality of multiplexers are all controlled by a test control signal.

8. A read method of a test mode with respect to a semiconductor memory device including a memory cell array and a plurality of output pins, the method comprising:
    storing a predetermined number applied from the outside of the semiconductor memory device;
    selecting one of the plurality of output pins corresponding to the predetermined number;
    comparing a plurality of output data read from the memory cell array during the test mode to generate a comparison result signal; and
    outputting the comparison result signal to the selected output pin.

9. A method for testing a memory module that comprises a plurality of semiconductor memory devices having a memory cell array and a plurality of output pins, the semiconductor memory devices being connected in common to a plurality of data buses corresponding to output pins of the semiconductor memory device, the method comprising:
    applying one of a plurality of predetermined numbers to each of the semiconductor memory devices to determine a corresponding output pin for each of memory devices during a test mode; and
    reading data synchronously from each of the semiconductor memory devices via output pins corresponding to the predetermined numbers applied to each memory device.

10. A method for testing a memory module, as recited in claim 9, wherein the predetermined numbers are all mutually exclusive.

* * * * *